United States Patent [19]

Scott

[11] 4,181,902
[45] Jan. 1, 1980

[54] FLUXON OSCILLATORS UTILIZING A RING SHAPED JOSEPHSON JUNCTION

[75] Inventor: Alwyn C. Scott, Madison, Wis.
[73] Assignee: Wisconsin Alumni Research Foundation, Madison, Wis.
[21] Appl. No.: 923,955
[22] Filed: Jul. 12, 1978
[51] Int. Cl.² .................... H01L 39/22; H03B 15/00
[52] U.S. Cl. ........................... 331/107 S; 307/306; 357/5
[58] Field of Search ............... 331/107 S; 307/306, 307/307; 357/5; 29/599, 600, 601; 174/15 CA

[56] References Cited

U.S. PATENT DOCUMENTS

| | | | |
|---|---|---|---|
| 3,643,176 | 2/1972 | Gregory et al. | 331/107 S X |
| 3,778,893 | 12/1973 | Thompson | 331/107 S X |
| 3,936,677 | 2/1976 | Fulton et al. | 307/306 |

OTHER PUBLICATIONS

Langenberg et al.; "Josephson-Type Superconducting Tunnel Junctions as Generators of Microwave and Submillimeter Wave Radiation"; Proceedings of the IEEE, Apr. 1966, pp. 560; 331-107S.
Chen and Langenberg; "Fine Structure in the Anomalous DC Current Singularities of a Josephson Tunnel Junction"; Low Temperature Physics, 1974; p. 289.
McLaughlin and Scott; "Fluxon Interactions"; Applied Physics Letters, vol. 30, No. 10, May 15, 1977.

Primary Examiner—Siegfried H. Grimm
Assistant Examiner—Edward P. Westin
Attorney, Agent, or Firm—Burmeister, York, Palmatier, Hamby & Jones

[57] ABSTRACT

The fluxon oscillators for producing electromagnetic radiation having a wavelength shorter than the shortest radio waves, but longer than the longest infrared radiation, may comprise two closely spaced superconductive ring-shaped members having a ring-shaped Josephson junction barrier therebetween capable of supporting the tunnelling of superconductive electrons across such barrier, a source of magnetic flux for initially producing at least one fluxon in the barrier, a power supply for producing an electrical biasing current between the superconductive members and across the barrier for causing movement of the fluxon along and around the ring-shaped barrier in a closed path, and a plurality of centers to produce enhanced superconductive electron current across the barrier, such centers being spaced around the ring-shaped barrier for causing cyclical variations in the velocity of the fluxon and thereby causing the radiation of electromagnetic energy at a frequency corresponding to the frequency of such cyclical variations. Such centers may comprise localized microshorts or weak links which are conductive to normal tunnelling electrons and exhibit enhanced tunnelling by superconductive electrons. Such weak links may be made of a normally conductive metal, such as copper, silver or gold. The superconductive members may be in the form of superimposed ring-shaped layers with the barrier sandwiched therebetween, or in the form of concentric inner and outer ring-shaped layers, with the barrier being disposed between the edges thereof. Such centers may also be provided by photoconductive material in the barrier, illuminated by a pattern of illumination.

15 Claims, 8 Drawing Figures

FLUXON OSCILLATORS UTILIZING A RING SHAPED JOSEPHSON JUNCTION

The Government has rights in this invention pursuant to Grant No. ENG75-08492 (144-G289) and IPA No. 0001 awarded by the National Science Foundation.

This invention relates to fluxon oscillators for producing electromagnetic radiation, which may have a wavelength in the range between the shortest radio waves and the longest infrared radiation. The radiation produced by the fluxon oscillators of the present invention is useful for communications and other purposes.

A fluxon is an elemental bundle or center of magnetic flux which can exist in a Josephson junction or barrier between two superconductive members. A Josephson junction comprises two superconductive members separated by a barrier which is so thin that superconductive electrons are able to tunnel across the barrier and between the superconductive members. In order to support the tunnelling of superconductive electrons, the Josephson barrier must be extremely thin, approximately 25 angstroms (A) or less. One angstrom is equal to one ten-billionth of a meter ($10^{-10}$ meter). The barrier in a Josephson junction may contain a material which is normally considered to be an electrically insulating material, or a material which is conductive to normal electrons but is not superconductive. The barrier may also contain a semiconductor or may simply be a vacuum. The structure comprising the two superconductors separated by the Josephson junction may be referred to as a Josephson transmission line (JTL).

Superconductivity is a property of various metals, such as tin, lead and indium, for example, when they are cooled to an extremely low temperature, below a critical temperature near absolute zero. The critical temperature for superconductivity varies for different metals, but is on the order of 4° Kelvin (K.). A superconductive material conducts an electrical current without any resistance or loss of energy.

Each fluxon or elemental bundle of magnetic flux is encircled and accompanied by a circulating superconductive current which flows through the two superconductors and tunnels across the barrier of the Josephson junction. The superconductive current associated with the fluxon persists indefinitely, because the current encounters no resistance and is not subject to any loss of energy.

A fluxon may be produced in a Josephson junction by using a permanent magnet or an electromagnet to produce a biasing magnetic flux in the junction, and then cooling the Josephson junction below the critical temperature for superconductivity. The biasing magnet or electromagnet may then be removed or deenergized. When the conductors of the Josephson junction become superconductive, the magnetic flux is expelled from the superconductive members and is concentrated in one or more elemental bundles or fluxons. Each fluxon has an elemental quantum of magnetic flux, due to the quantum mechanical nature of superconductivity. The quantum of flux is approximately $2.0678 \times 10^{-15}$ volt-seconds.

One object of the present invention is to employ the motion of fluxons to produce electromagnetic radiation. A further object is to provide a fluxon oscillator in which a cyclically variable velocity is imparted to one or more fluxons, to produce electromagnetic radiation from the fluxons.

To achieve these and other objects, the present invention preferably provides a fluxon oscillator, comprising first and second closely spaced superconductive members having a ring-shaped Josephson junction barrier therebetween capable of supporting the tunnelling of superconductive electrons across such barrier and between the superconductive members, means for initially producing at least one fluxon in the barrier, means for producing a biasing current between the superconductive members and across the barrier for causing movement of the fluxon along and around the ring-shaped barrier in a closed path, and means for producing a plurality of centers of enhanced superconductive electron current across the barrier, such centers being spaced around the ring-shaped barrier for causing cyclical variations in the velocity of the fluxon and thereby causing the radiation of electromagnetic energy at a frequency corresponding to the frequency of the cyclical variations.

A cryogenic system is preferably provided for maintaining the members and the barrier at a temperature below the critical temperature for superconductivity in the members and the barrier.

The centers of enhanced superconductive current may comprise localized microshorts which are conductive to normal tunneling electrons and exhibit enhanced tunnelling by superconductive electrons.

In another embodiment, such centers may comprise localized conductive links between the superconductive members and across the barrier.

The superconductive members may be in the form of superimposed ring-shaped layers with the barrier sandwiched between such layers.

In another embodiment, the superconductive members may take the form of concentric inner and outer layers, the barrier being disposed between the outer edge of the inner layer and the inner edge of the outer layer. The centers of enhanced superconductive current may comprise localized conductive links extending across the barrier between the outer edge of the inner layer and the inner edge of the outer layer.

The centers of enhanced superconductive current may be formed by photoconductive material in the barrier. The location of such centers may be established by a pattern of illumination of such photoconductive material.

The initial fluxon or fluxons may be produced by employing magnet means for providing an initial biasing flux having a component extending transversely to the barrier, whereby at least one fluxon is trapped in the barrier when the members and the barrier are cooled below the critical temperature for superconductivity.

Further objects, advantages and features of the present invention will appear from the following description, taken with the accompanying drawings, in which.

Figure 1:
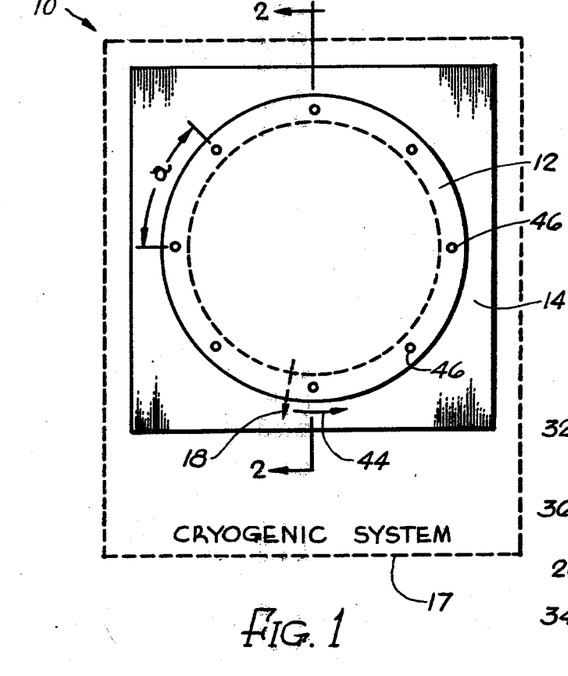
FIG. 1 is a diagrammatic view, illustrating a fluxon oscillator to be described as an illustrative embodiment of the present invention.
Figure 2:
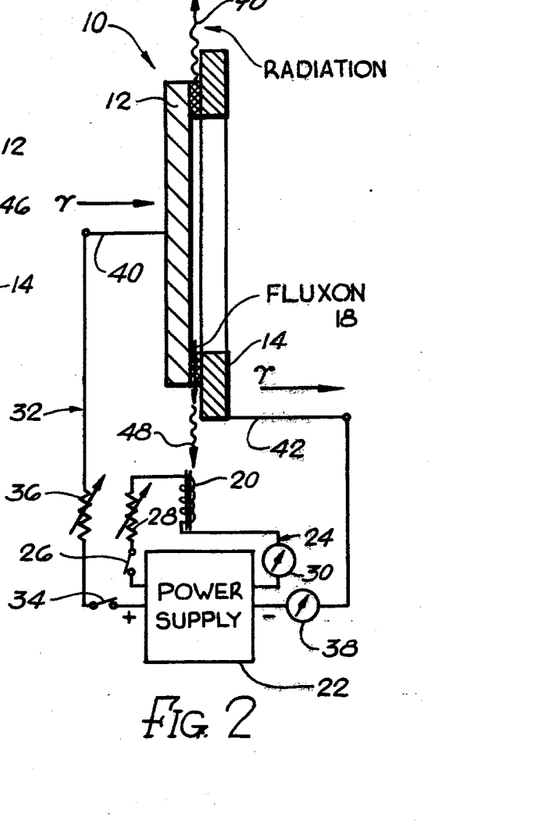
FIG. 2 is a diagrammatic section, taken generally along the line 2—2 in FIG. 1.
Figure 3:
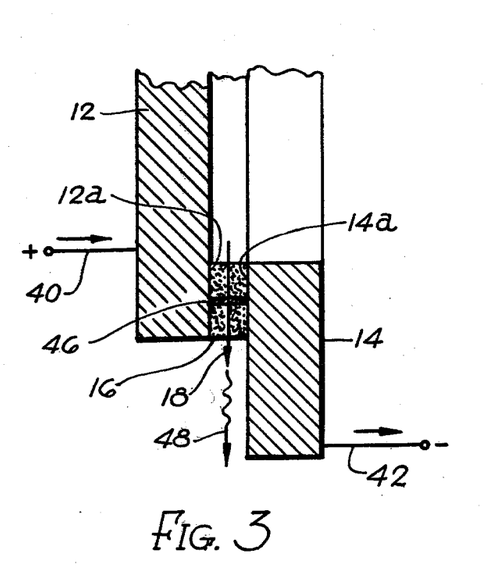
FIG. 3 is a diagrammatic enlarged fragmentary section corresponding to a portion of FIG. 2.

As just indicated, FIGS. 1-3 illustrate a fluxon oscillator 10 comprising first and second superconductive members 12 and 14 having generally ring-shaped confronting areas or portions 12a and 14a, between which a thin barrier 16 is provided. The barrier 16 affords a Josephson junction between the superconductive members 12 and 14, in that the barrier 16 is sufficiently thin to be capable of supporting the tunnelling of superconductive electrons across the barrier and between the superconductive members. Thus, a superconductive current can flow across the barrier 16, without resistance and without any loss of energy. To provide a Josephson junction which will support the tunnelling of superconductive electrons, the barrier 16 must be extremely thin, approximately 25 angstroms or less. It will be evident that the thickness of the barrier 16 is greatly exaggerated in the drawings, for clarity of illustration.

The superconductive members 12 and 14 are illustrated as overlapping layers, with the barrier 16 sandwiched therebetween. However, the superconductive members 12 and 14 and the barrier 16 may assume various other forms. The superconductive members 12 and 14 may be made of any suitable material which has the property of superconductivity at extremely low temperatures, near absolute zero. For example, the superconductive members 12 and 14 may be made of lead, tin or indium, all of which exhibit superconductivity at extremely low temperatures, below the respective critical temperatures for superconductivity. Such critical temperatures are different for different materials, but are on the order of 4° Kelvin (K.). The superconductive members may also be made of various alloys which exhibit superconductivity. The thickness of the superconductive members 12 and 14 may be varied over a wide range, but the members should be sufficiently thick to avoid excessive current density, which tends to defeat the superconductive state.

To provide and maintain the superconductive state, the fluxon oscillator 10, including the members 12 and 14 and the barrier 16, are contained within a cryogenic system 17, capable of cooling the members 12 and 14 and the barrier 16 below the critical temperature for superconductivity. The overall size of the superconductive members 12 and 14 may be varied over a wide range. Generally, it is convenient to make the members 12 and 14 quite small, on the order of 1 cm in overall maximum dimension, so that the fluxon oscillator 10 can easily be accommodated within the limited space available in a typical cryogenic dewar or chamber. For convenience, the superconductive members 12 and 14 may be mounted on any suitable support. For example, one convenient support is a standard glass microscope slide, which will fit within a typical cryogenic dewar.

The structure comprising the superconductive members 12 and 14 and the annular Josephson junction barrier 16 may be regarded as an annular Josephson transmission line (JTL). The Josephson junction barrier 16 may contain a material which is normally considered to be an insulating material, such as an oxide of the metal employed in one of the members 12 and 14, for example. Alternatively, the barrier 16 may contain a material which is ordinarily considered to be an electrical conductor, but not a superconductor, such as copper, silver, aluminum or gold, for example. As a further alternative, the barrier 16 may contain a semiconductor, such as cadmium sulfide or cadmium telluride, for example. The barrier 16 can also simply be a vacuum space.

Initially, one or more fluxons are produced in the ring-shaped barrier 16. Thus, a fluxon 18 is shown or represented diagrammatically in FIGS. 1-3 by an arrow, which represents the direction of the quantum of magnetic flux involved in the fluxon 18. As previously indicated, a fluxon may be regarded as a bundle or quantum of magnetic flux. The fluxon has a stable existence in the superconductive Josephson junction barrier 16.

One or more of the fluxons 18 are produced initially in any suitable manner. For example, an initial biasing flux may be produced in the barrier 16 by using magnet means, such as a permanent magnet or the illustrated electromagnet 20, while cooling the superconductive members 12 and 14 and the barrier 16 below the critical temperature for superconductivity. When the members 12 and 14 have become superconductive, the biasing magnet 20 may be removed or deenergized. The superconductivity of the members 12 and 14 causes the magnetic flux to be expelled from the superconductive members, but the flux is maintained in the barrier 16 in the form of fluxons or discrete quanta of magnetic flux. Each fluxon or quantum of flux is encircled by and associated with a circulating superconductive current, which circulates through the superconductive members 12 and 14 and across the Josephson junction barrier 16. The biasing magnet 20 is positioned and polarized to provide the desired polarity and direction of the biasing magnetic flux, so that the fluxons will have the desired polarity and direction.

As shown in FIG. 2, the electromagnet 20 may be energized by a direct current power supply 22, connected in a series circuit 24, which includes the electromagnet 20. As illustrated, the series circuit 24 also includes a switch 26 for opening and closing the circuit, means, such as a variable resistor 28, for varying the current in the circuit, and means, such as a meter 30, for measuring the current.

Initially, the fluxons 18 are stationary in the Josephson junction barrier 16, in the absence of any biasing current. However, the fluxon oscillator 10 includes means for producing such a biasing current through the superconductive members 12 and 14 and across the Josephson junction barrier 16. Such biasing current is indicated as $\gamma$ in FIG. 2. The biasing current may be provided by the direct current power supply 22, which is connected to a series circuit 32, including the superconductive members 12 and 14 and the barrier 16. The illustrated circuit 32 also includes a switch 34 for opening and closing the circuit, means, such as a variable resistor 36, for varying the biasing current, and means, such as a meter 38, for measuring the biasing current. The series circuit 32 includes leads 40 and 42 connected to the superconductive members 12 and 14.

The biasing current 42 produces a Lorentz force on the fluxon 18, which propels the fluxon in a closed ring-shaped path, along and around the Josephson junction barrier 16. The circumferential motion of the fluxon 18 is indicated by a directional arrow 44 in FIG. 1.

In order to produce cyclical variations in the velocity of the fluxon or fluxons 18, the Josephson junction barrier 16 is provided with a plurality of centers 46 of enhanced superconductive electron current across the barrier. Such centers 46 are spaced at intervals around the circumference of the ring-shaped barrier 16. Preferably, the centers 46 are equally spaced, with a regular interval between such centers. In FIG. 1, the distance or interval between the centers 46 is indicated by the dimension "a".

As each fluxon 18 travels in its closed path or orbit around the ring-shaped barrier 16, the velocity of the fluxon is varied or wobbled as it passes each center 46 of enhanced superconductive current. As the fluxon 18 approaches each center 46, the velocity of the fluxon is decreased. After the fluxon 18 passes the center 46, the velocity of the fluxon is increased to its average value, as the fluxon moves away from the center 46 of enhanced superconductive current. This cyclical variation or wobbling of the velocity of the fluxon 18 produces the radiation of electromagnetic wave energy by the fluxon. Such radiation is indicated by the arrows 48 in FIGS. 2 and 3. Such electromagnetic radiation is at the frequency of the variation in the fluxon velocity. Such frequency is directly proportional to the average velocity of the fluxon and the number of centers 46 around the circumference of the Josephson junction barrier 16. To put this relationship in another way, the frequency of the electromagnetic radiation is directly proportional to the velocity of the fluxon 18, and inversely proportional to the distance a between the successive centers 46 of enhanced superconductive electron current. The velocity of the fluxon 18 is a function of the biasing current $\gamma$. Thus, the frequency of the electromagnetic radiation can be varied by adjusting the magnitude of the biasing current $\gamma$.

The centers 46 of enhanced superconductive current are areas where the tunnelling of superconductive electrons across the barrier 16 is facilitated or increased in some suitable manner. For example, the centers 46 may take the form of microshorts, produced by small elements of electrically conductive material across the barrier 16. Such microshorts may be made of materials which are conductors but not superconductors. Examples of such materials are metals such as copper, silver, aluminum and gold. Such microshorts may be produced in the barrier 16 by circuit printing techniques. It has been found that elements which are conductive to normal electrons are also enhanced in their ability to support the tunnelling by superconductive electrons.

The centers 46 may also be formed by photoconductive material in the barrier 16. Such photoconductive materials may include photosensitive semi-conductors, such as cadmium sulfide and cadmium telluride. The photoconductive materials may be provided in the barrier 16 by circuit printing techniques. When such photoconductive materials are employed, the locations of the centers 46 may be established by illuminating the photoconductive material with a pattern of light, while the superconductive members 12 and 14 and the barrier 16 are being cooled below the critical temperature for superconductivity. The illumination by the pattern of light can then be removed, but the photoconductivity will persist and will cause enhanced tunnelling by superconductive electrons.

It has been found that the velocity of the fluxon 18 approaches a limiting value which is about 1/15 or 1/16 of the speed of light in free space. The frequency of the electromagnetic radiation from the fluxon 18 can be increased by decreasing the spacing "a" between the centers 46 of enhanced superconductive electron current. However, the power output of the fluxon oscillator 10 decreases as the spacing "a" approaches the effective size of the fluxon. This limitation makes it undesirable to reduce the spacing "a" below about 5 microns ($5 \times 10^{-6}$ meter). Because of these limitations, the maximum usable frequency of the electromagnetic radiation from the fluxon oscillator is about $4 \times 10^{12}$ cycles per second. This frequency corresponds to an electromagnetic wavelength in free space of about 75 microns or 0.075 mm. This wavelength is considerably shorter than the shortest radio waves, heretofore produced, but longer than the longest infrared waves. Thus, the fluxon oscillator is an important advance toward the generation of electromagnetic radiation which will bridge the gap between radio waves and infrared waves.

It will be understood that the spacing "a" between the centers 46 of enhanced superconductive tunnelling is greatly exaggerated in FIG. 1 for clarity of illustration. As just indicated, the spacing "a" may be as small as 5 microns, or even less.

It will also be understood that there may be many more of the centers 46 than illustrated in FIG. 1. If the spacing a is 5 microns and the largest dimension of the superconductive members 12 and 14 is about 1 cm, there will be over 5000 centers 46 around the ring-shaped Josephson junction barrier 16. Printed circuit techniques make it possible to provide such a large number of centers 46.

The superconductive members 12 and 14 may be in the form of thin layers, produced by circuit printing techniques. It is advantageous to make at least one of the members 12 and 14 sufficiently thin to be penetrated by the electromagnetic radiation produced by the wobbling motion of the fluxons 18. In this way, the radiation can escape more readily from the Josephson junction barrier 16. If the members 12 and 14 are too thick to be penetrated by the electromagnetic radiation, such radiation must escape through the edges of the barrier 16, as indicated by the outwardly directed arrows 48 in FIGS. 2 and 3. If desired, the overlapping portions 12a and 14a of the superconductive members 12 and 14 may be made thinner than the other portions of the members.

When the barrier 16 contains a light sensitive semiconductor, such as cadmium sulfide or cadmium telluride, it is advantageous to make at least one of the superconductive members 12 and 14 sufficiently thin to be penetrated by light, so that the centers 46 of enhanced superconductive tunnelling can readily be established by a pattern of illumination.

Figures 4, 5:
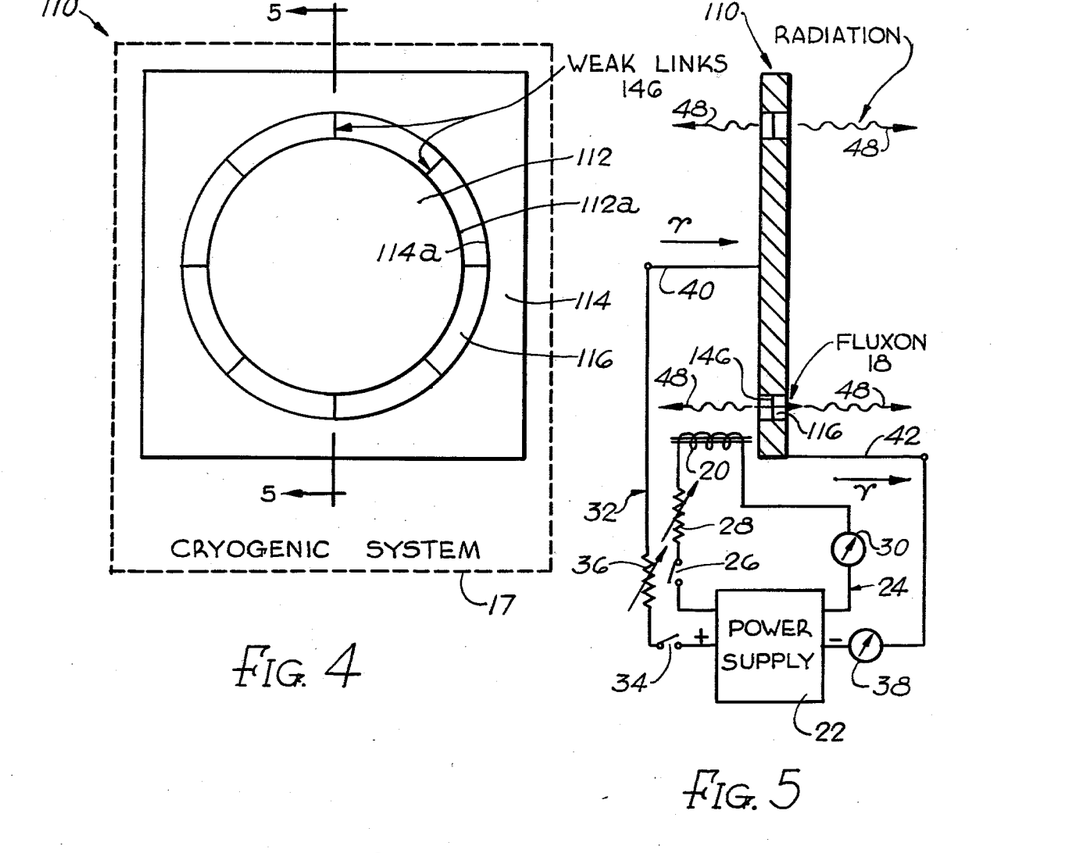
FIG. 4 is a diagrammatic view, similar to FIG. 1, but showing a second, modified embodiment of the present invention.
FIG. 5 is a diagrammatic section, taken generally along the line 5—5 in FIG. 4.
Figure 6:
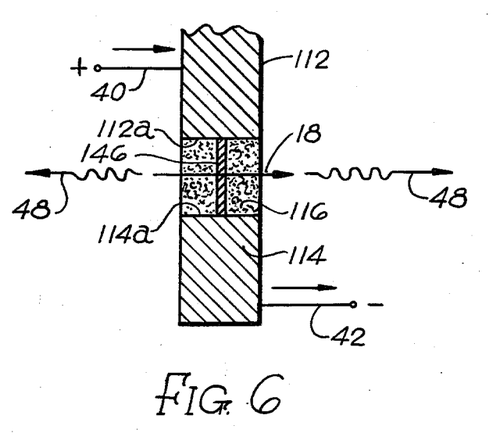
FIG. 6 is a diagrammatic enlarged fragmentary section, corresponding to a portion of FIG. 5.

FIGS. 1-3 illustrate only one of many possible configurations of the superconductive members 12 and 14 and the Josephson junction barrier 16. Another suitable configuration is shown in FIGS. 4-6, which illustrate a modified fluxon oscillator 110, comprising first and second superconductive members 112 and 114, with ring-shaped Josephson junction barrier 116 therebetween. In this case, the superconductive members 112 and 114 have confronting ring-shaped portions 112a and 114a which are concentric and are disposed on opposite sides of the barrier 116. The superconductive members 112 and 114 may be in the form of concentric layers, produced by circuit printing techniques. The confronting portions may take the form of the outer edge 112a of the superconductive member 112 and the inner edge 114a of the superconductive member 114.

It will be understood that the thickness of the Josephson junction barrier 116 is greatly exaggerated in FIGS. 4-6 for clarity of illustration. The barrier 116, like the barrier 16, is sufficiently thin to support the tunnelling of superconductive electrons across the barrier. As before, the thickness of the barrier 116 may be about 25 microns or less. The pertinent information given above with regard to the barrier 16 is also applicable to the barrier 116. Likewise, the pertinent information with regard to the superconductive members 12 and 14 is also applicable to the superconductive members 112 and 114.

As before, one or more fluxons 18 are produced initially in the barrier 116 by using the magnet means 20 to produce a biasing magnetic flux in the barrier 116, while cooling the superconductive members 112 and 114 and the barrier 116 below the critical temperature for superconductivity. As before, each fluxon 18 is oriented transversely in the barrier 116. However, due to the fact that the barrier 116 is disposed between the concentric confronting edge portions 112a and 114a, each fluxon 18 is oriented in a direction generally parallel to the axis of the ring-shaped barrier 116, rather than in a radial direction, as in the construction of FIGS. 1-3.

As before, the biasing current $\gamma$ is provided between the superconductive members 112 and 114 and across the barrier 116. This biasing current $\gamma$ produces a Lorentz force on each fluxon 18, so as to propel the fluxon in a closed path around the ring-shaped barrier 116. The fluxon 18 approaches a limiting velocity which is on the order of 1/15 or 1/16 of the speed of light in free space. As before, the barrier 116 is provided with spaced centers 146 of enhanced superconductive electron tunnelling across the barrier 116. As before, each center 146 causes the velocity of each fluxon to decrease as the fluxon approaches the center, and then to increase as the fluxon moves away from the center, after passing the center. This wobbling or modulation of the fluxon velocity causes the production of electromagnetic radiation from the fluxon, as indicated by the arrows 48.

The centers 146 of enhanced superconductive electron current across the barrier 116 may be in the form of weak links which extend radially between the confronting ring-shaped portions 112a and 114a of the superconductive members 112 and 114. The weak links 146 may be produced by circuit printing techniques. As before, the weak links 146 may be made of a material which is normally considered to be conductive but not superconductive. Such materials include normally conductive metals, such as copper, silver, aluminum or gold, for example. The weak links 146 may also be produced by providing a photoconductor in the barrier 116, as described in connection with the centers 46 of FIGS. 1-6. The location of the centers 146 may be determined by illuminating the photoconductive material with a pattern of light. Such illumination is facilitated by the configuration of the barrier 116, with its ends exposed in a direction parallel to the axis of the ring-shaped barrier 116.

The configuration of the barrier 116, disposed between the concentric surfaces 112a and 114a of the superconductors 112 and 114, also provides an efficient waveguide structure for the escape of the electromagnetic radiation from the fluxons 18, as indicated by the arrows 48, which are directed parallel with the axis of the ring-shaped barrier 116. This direction makes it easy to focus and direct the electromagnetic radiation from the fluxons.

In other respects, the fluxon oscillator 110 of FIGS. 4-6 may be the same as the fluxon oscillator 10 of FIGS. 1-3. Corresponding components in FIGS. 4-6 have been given the same reference characters as in FIGS. 1-3, so that the previous description will be fully applicable.

Other means may be employed to produce the centers of enhanced superconductive electron current across the Josephson junction barrier between the superconductive members. For example, the centers may be produced by locally reducing the thickness of the barrier at the centers, to enhance the tunnelling of superconductive electrons across the barrier. The areas of reduced thickness in the barrier may be produced by providing corrugations, projections or scallops on the superconductive members.

Figure 7:
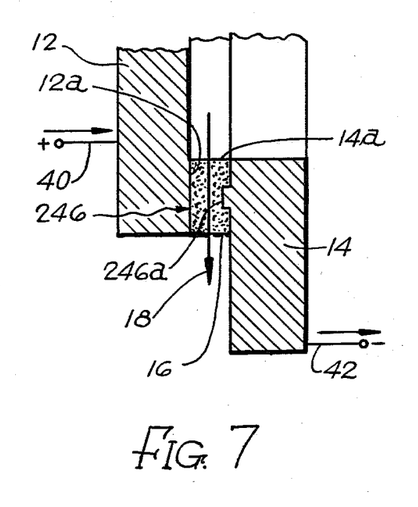
FIG. 7 is similar to FIG. 3, but shows a modification.

The centers of enhanced superconductive tunnelling across the barrier can also be produced by locally increasing the transverse width of the barrier so that the area available for superconductive electron tunnelling will be increased locally at the spaced centers. The transverse width of the barrier can be increased locally by providing corrugations, projections or scallops on the superconductive members. Thus, FIG. 7 illustrates a modified construction, similar to that of FIG. 3, in which the centers 46 of FIG. 3 are replaced by centers 246 of enhanced superconductive electron current, each of such centers 246 being in the form of an area of reduced thickness in the barrier 16. Such area of reduced thickness is produced by providing a projection or corrugation 246a on either or both of the superconductive members 12 and 14. In this case, the projection or corrugation 246a is on the superconductive member 14 and is directed toward the superconductive member 12. The reduced thickness of the Josephson junction barrier 16 at the center 246 facilitates the tunnelling of superconductive electrons across the barrier 16.

Figure 8:
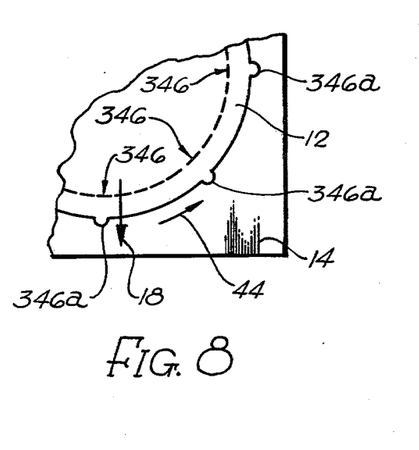
FIG. 8 is similar to FIG. 1, but shows a modification.

FIG. 8 illustrates another modified construction, similar to that of FIG. 1, in which the centers 46 are replaced by centers 346 of enhanced superconductive electron current across the barrier 16. At each of the centers 346, the transverse width of the barrier 116 is increased by providing a projection or scallop on one or both edges of one or both of the superconductors 12 and 14. In this case, the projection or scallop 346a is on the outer edge of the superconductive member 12. The increased transverse width of the barrier 16, due to the projection 346a, increases the superconductive electron current across the barricr 16 at the center 346.

The fluxon oscillators of FIGS. 1-8 are tuneable by varying the biasing current $\gamma$. Increasing the biasing current $\gamma$ tends to increase the velocity with which the fluxons are propagated around the ring-shaped barrier, so that the frequency of the electromagnetic radiation from the fluxons is increased. The increased frequency means that the wavelength of the electromagnetic radiation is decreased. Decreasing the biasing current $\gamma$ has the opposite effect. Thus, decreasing the biasing current $\gamma$ tends to decrease the velocity of the fluxons, so that the frequency of the electromagnetic radiation from the fluxons is decreased. This means that the wavelength of such radiation is increased.

In order to maintain superconductivity in the superconductive members, and across the Josephson junction barrier, the current density produced by the biasing current $\gamma$ should not exceed the maximum Josephson current density, which is approximately $10^8$ amperes/meter$^2$.

The annular fluxon oscillator 10 of FIGS. 1-3, comprising the superconductors 12 and 14 and the barrier 16 may be regarded as an annular Josephson transmission line (JTL). The general theory of Josephson transmission lines is analyzed in a paper by the present applicant, A. C. Scott, et al., in J. Appl. Phys. 47 (1976), 3272. Around this annular JTL, a fluxon or quantum unit of magnetic flux propagates circumferentially. The equally spaced discrete Josephson junction current centers or microshorts are effective to cause periodic variations in the fluxon velocity. It is the resulting wobble motion of the fluxon which causes it to radiate electromagnetic energy.

In appropriately normalized units, the magnetic flux ($\phi$) in the JTL will be governed by the nonlinear evolution equation $$\phi_{xx} - \phi_{tt} - \sin\phi = \alpha\phi_t - \beta\phi_{xxt} + \gamma + \mu \sum_{n=1}^{N} \delta(x - na)\sin\phi \quad (1)$$

where the $\alpha$ and $\beta$ terms represent dissipation from normal electron current; $\beta$ is the bias current which exerts a Lorentz force on the fluxon; x and t are the variables of circumferential distance and time; and the summation describes the discrete Josephson junction centers, n in number, equally spaced by the circumferential distance "a". Perturbation analysis of equation (1), in accordance with the paper by D. W. McLaughlin and A. C. Scott in Applied Phys. Letts., May 1977, shows that a fluxon solution $$\phi = 4\tan^{-1}\left[\exp\left(\frac{x - X(T)}{\sqrt{1 - u^2(t)}}\right)\right] \quad (2)$$

will have its position, X(t), and its velocity, u(t), modulated according to the ordinary differential equations $$\dot{u} = \frac{\pi\gamma}{4}(1 - u^2)^{3/2} - \alpha u(1 - u^2) - \frac{\beta}{3}u + \frac{\mu}{2}(1 - u^2)\sum_{n=1}^{N}\text{sech}^2\left(\frac{X - na}{\sqrt{1 - u^2}}\right)\tanh\left(\frac{X - na}{\sqrt{1 - u^2}}\right) \quad (3a)$$

$$\dot{X} = u - \frac{\mu}{2}u\sum_{n=1}^{N}(X - na)\text{sech}^2\left(\frac{X - na}{\sqrt{1 - u^2}}\right)\tanh\left(\frac{X - na}{\sqrt{1 - u^2}}\right) \quad (3b)$$

Analysis of equations (3a) and (3b) shows that for large enough bias current ($\gamma$) the fluxon will undergo a wobbling motion that can be represented by a truncated Fourier series $$X(t) \doteq u_o t + A\cos\omega_o t. \quad (4)$$

In equation (4), $u_o$ is the average fluxon velocity and $\omega_o$ is the "wobble frequency". These are evidently related $$\omega_o = 2\pi u_o/a. \quad (5)$$

Since the lowest frequency for the junction mode is the Josephson frequency (unity in normalized units), a necessary condition for fluxon radiation into the JTL is $\omega_o > 1$ or $$a > 2\pi u_o. \quad (6)$$

If this condition is met, the radiated power from the fluxon into the JTL can be directly calculated.

Condition (6) is readily satisfied by setting a=1 in normalized units or, in laboratory units, $$a = \lambda_J \quad (7)$$

the Josephson penetration length. The wobble frequency in laboratory units will then be $$f_o \doteq c/15\lambda_J \quad (8)$$

since the limiting wave velocity on the JTL is about c/15 (or 1/15th of the free space velocity of light). For a Josephson junction $$\lambda_J = (5 \times 10^4/\sqrt{J_o}) \text{ microns} \quad (9)$$

where $J_o$ is the maximum Josephson current density in amperes/meter$^2$. Taking $J_o = 10^8$ amperes/meter$^2$ gives $\lambda_J = 5$ microns or $$f_o \doteq 4 \times 10^{12} \text{ cycles/second.}$$

This corresponds to a free space electromagnetic wavelength of $$\lambda \doteq 0.075 \text{ mm.}$$

The fluxon oscillator 110 of FIGS. 4–6 has the advantage that the coupling of the electromagnetic radiation to an external load is facilitated. The radiation is into an open wave guide with favorable geometry for lateral radiation. In the fluxon oscillator 10 of FIGS. 1–3, the coupling of the radiation to an external field is facilitated if the JTL is made narrower. This is achieved by making the annular Josephson barrier 16 narrower in radial width. The fluxon oscillator of FIGS. 4–6 represents the limit of zero width.

In many instances, the preceding description has referred to one fluxon for simplicity, but several fluxons can be used, with a corresponding increase in output power. The number of fluxons can be at least as great as the number of microshorts or weak links.

The fluxon oscillators of the present invention provide high power output, because the annular Josephson junction may have a large area with a large number of microshorts, weak links or other centers of enhanced superconductive electron tunnelling current.

The fluxon oscillators are reasonably easy to construct, because the dimension of approximately 5 microns between the microshorts, weak links or other Josephson centers is readily obtained by modern photo fabrication techniques.

The fluxon oscillators provide simple output coupling, in that the circular geometry lends itself to focussing of the electromagnetic radiation by the use of reflectors and lenses. The output coupling is particularly simple as to the fluxon oscillator of FIGS. 4–6.

The fluxon oscillators provide electromagnetic radiation of short wavelength, shorter than the currently available radio wave generators. The output wavelength of the fluxon oscillators may be in the submillimeter range.

The fluxon oscillators are easily tuneable by varying the biasing current $\gamma$. This changes the velocity of the fluxons, which in turn changes the output frequency.

While the circular geometry of the ring-shaped fluxon oscillators is advantageous, it will be understood that the geometry does not have to be strictly circular, and that various non-circular but ring-shaped geometries may be employed.

I claim:

1. A fluxon oscillator, comprising first and second closely spaced superconductive members having a ring-shaped Josephson junction barrier therebetween capable of supporting the tunnelling of superconductive electrons across said barrier and between said superconductive members, means for initially producing at least one fluxon in said barrier, means for producing a biasing current between said superconductive members and across said barrier for causing movement of said fluxon along and around said ring-shaped barrier in a closed path, and means for producing a plurality of centers of enhanced superconductive electron current across said barrier, said centers being spaced around said ring-shaped barrier for causing cyclical variations in the velocity of the fluxon and thereby causing the radiation of electromagnetic energy at a frequency corresponding to the frequency of said cyclical variations.

2. A fluxon oscillator according to claim 1, including cryogenic means for maintaining said members and said barrier at a temperature below the critical temperature for superconductivity in said members and said barrier.

3. A fluxon oscillator according to claim 1, in which said centers comprise localized microshorts which are conductive to normal tunnelling electrons and exhibit enhanced tunnelling by superconductive electrons.

4. A fluxon oscillator according to claim 1, in which said centers comprise localized conductive links between said superconductive members and across said barrier.

5. A fluxon oscillator according to claim 1, in which said superconductive members are in the form of superimposed layers with said barrier sandwiched between said layers.

6. A fluxon oscillator according to claim 1, in which said superconductive members take the form of concentric inner and outer layers, said barrier being disposed between the outer edge of said inner layer and the inner edge of said outer layer.

7. A fluxon oscillator according to claim 1, in which said means for producing at least one initial fluxon comprise magnet means for producing an initial biasing flux having a component extending transversely in said barrier whereby at least one fluxon is trapped in said barrier when said members and said barrier are cooled below the critical temperature for superconductivity.

8. A fluxon oscillator according to claim 1, in which said centers are formed by photoconductive material in said barrier.

9. A fluxon oscillator according to claim 1, in which said centers comprise photoconductive material in said barrier, the location of said centers being established by a pattern of illumination of said photoconductive material.

10. A fluxon oscillator according to claim 1, in which said superconductive members take the form of concentric inner and outer layers, said barrier being disposed between the outer edge of said inner layer and the inner edge of said outer layer, said centers comprising localized conductive links extending across said barrier between the outer edge of said inner layer and the inner edge of said outer layer.

11. A fluxon oscillator according to claim 1, in which said centers are comprised of areas of reduced thickness in said barrier to enhance the tunnelling of superconductive electrons across said barrier in said areas.

12. A fluxon oscillator according to claim 1, in which said centers comprise projecting means on at least one of said superconductive members for producing areas of reduced thickness in said barrier to facilitate the tunnelling of superconductive electrons across said barrier in said areas.

13. A fluxon oscillator according to claim 1, in which said centers comprise corrugations on at least one of said superconductive members for producing areas of reduced thickness in said barrier to enhance the tunnelling by superconductive electrons across said barrier in said areas.

14. A fluxon oscillator according to claim 1, in which said centers are comprised of areas of increased width in said barrier to enhance the tunnelling by superconductive electrons across said barrier in said areas.

15. A fluxon oscillator according to claim 1, in which said centers comprise projecting means on at least one of said superconductive members for producing areas of increased width in said barrier to enhance the tunnelling by superconductive electrons across said barrier in said areas.

* * * * *

UNITED STATES PATENT AND TRADEMARK OFFICE
CERTIFICATE OF CORRECTION

PATENT NO. : 4,181,902
DATED : January 1, 1980
INVENTOR(S) : Alwyn C. Scott

It is certified that error appears in the above-identified patent and that said Letters Patent are hereby corrected as shown below:

Column 9, numbered line 19, " $\beta$ " should be -- $\gamma$ --

Column 9, last line, Equation (6), printed as "$\alpha > 2\pi u_o$" should be -- $\alpha < 2\pi u_o$ --

Signed and Sealed this

Eighteenth Day of March 1980

[SEAL]

Attest:

SIDNEY A. DIAMOND

Attesting Officer

Commissioner of Patents and Trademarks